United States Patent
Lou et al.

[11] Patent Number: 6,074,913
[45] Date of Patent: Jun. 13, 2000

[54] METHOD FOR FORMING A DRAM CAPACITOR

[75] Inventors: Chine-Gie Lou, Hsinchu Hsien; Yeur-Luen Tu, Taichung, both of Taiwan

[73] Assignee: Worldwide Semiconductor Manufacturing Corporation, Hsinchu, Taiwan

[21] Appl. No.: 09/108,901

[22] Filed: Jul. 1, 1998

[51] Int. Cl.[7] .............................................. H01L 21/8242
[52] U.S. Cl. ........................................... 438/255; 438/398
[58] Field of Search ................................. 438/238–240, 438/253–256, 396–399, 381

[56] References Cited

U.S. PATENT DOCUMENTS

| | | |
|---|---|---|
| 5,142,639 | 8/1992 | Kohyama et al. . |
| 5,208,726 | 5/1993 | Apel . |
| 5,268,315 | 12/1993 | Prasad et al. . |
| 5,351,163 | 9/1994 | Dawson et al. . |
| 5,406,447 | 4/1995 | Miyazaki . |
| 5,427,974 | 6/1995 | Lur et al. . |
| 5,650,351 | 7/1997 | Wu . |
| 5,960,280 | 9/1999 | Jenq et al. ................................ 438/254 |
| 5,966,612 | 10/1999 | Wu ........................................... 438/398 |

*Primary Examiner*—Jey Tsai
*Attorney, Agent, or Firm*—Blakely, Sokoloff, Taylor & Zafman, LLP

[57] ABSTRACT

A method for manufacturing a metal-insulator-metal capacitor on a substrate is disclosed. The method comprises the steps of: forming a first dielectric layer onto said substrate; patterning and etching said first dielectric layer to form a contact opening; forming a first metal layer onto said first dielectric layer and into said contact opening; forming a barrier layer onto said first metal layer; forming a second dielectric layer onto said barrier layer; forming a discrete HSG layer onto said second dielectric layer; etching said second dielectric layer by using said HSG layer as a mask; stripping said HSG layer; etching said barrier layer and said first metal layer by using a remaining portion of said second dielectric layer as a mask; stripping said remaining portion of said second dielectric layer; patterning and etching a remaining portion of said barrier layer and a remaining portion of said first metal layer; forming a third dielectric layer over said barrier layer, said first metal layer and said first dielectric layer; and forming a second metal layer over said third dielectric layer.

12 Claims, 2 Drawing Sheets

METHOD FOR FORMING A DRAM CAPACITOR

FIELD OF THE INVENTION

This invention relates to semiconductor memories, and more particularly, to an improved method for making a DRAM capacitor.

BACKGROUND OF THE INVENTION

It has been a recent trend in dynamic random access memory (DRAM) to increase the density of DRAM integrated circuits. However, as higher density DRAM cells are developed, the area available for capacitors that are used in the DRAM cells decreases. In order to decrease the area of capacitors while maintaining reliability standards, it is important to be able to maintain the capacitance of each capacitor while decreasing its area. Recently, capacitors having a three-dimensional structure have been suggested to increase cell capacitance. Such capacitors include, for example, double-stacked, fin-structured, cylindrical, spread-stacked, and box structured capacitors. In addition, where a polysilicon storage node is used, capacitance is increased by forming hemispherical grain polysilicon (HSG) on the polysilicon layer.

Although metal-insulator-metal (MIM) capacitors have the advantages of low interfacial reaction, high capacitance and low contact resistance ($R_c$), HSG cannot be grown directly on tungsten or other metal conductors in MIM capacitors. Furthermore, the method to manufacture crown or fin structures does not currently apply to MIM capacitors.

The present invention is directed to an improved method for forming a DRAM capacitor. The method forms a capacitor that has a MIM structure and utilizes HSG to create a crown structure.

SUMMARY OF THE INVENTION

A method for manufacturing a metal-insulator-metal capacitor on a substrate is disclosed. The method comprises the steps of: forming a first dielectric layer onto said substrate; patterning and etching said first dielectric layer to form a contact opening; forming a first metal layer onto said first dielectric layer and into said contact opening; forming a barrier layer onto said first metal layer; forming a second dielectric layer onto said barrier layer; forming a discrete HSG layer onto said second dielectric layer; etching said second dielectric layer by using said HSG layer as a mask; stripping said HSG layer; etching said barrier layer and said first metal layer by using a remaining portion of said second dielectric layer as a mask; stripping said remaining portion of said second dielectric layer; patterning and etching a remaining portion of said barrier layer and a remaining portion of said first metal layer; forming a third dielectric layer over said barrier layer, said first metal layer and said first dielectric layer; and forming a second metal layer over said third dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the accompanying drawings. The present invention provides a method of forming a DRAM capacitor. The method uses a discrete HSG layer to form MIM capacitors having a crown structure and delivering a large cell capacitance.

Figure 1:
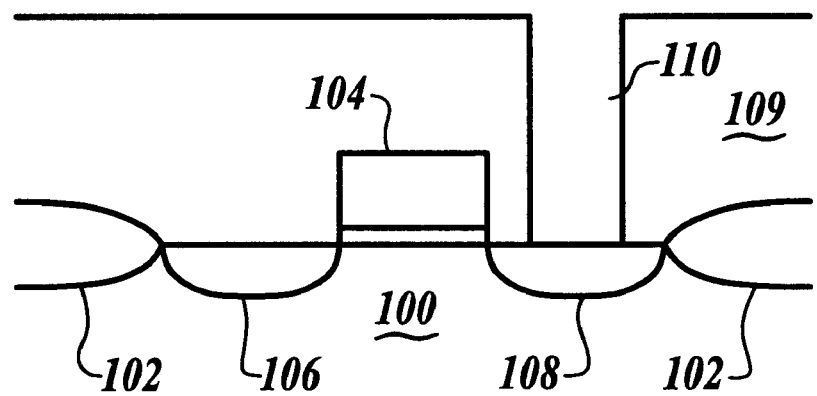
FIGS. 1–4 are cross-sectional views of a semiconductor substrate illustrating the steps of the present invention for forming a DRAM capacitor.

Turning to FIG. 1, a semiconductor substrate 100 is shown. The substrate is understood to possibly include a semiconductor wafer, active and passive devices formed within the wafer, and layers formed on the wafer's surface. The term "substrate" is meant to include devices formed within a semiconductor wafer and the layers overlying the wafer. In the preferred embodiment, a single crystal p-type substrate with a <100> crystallographic orientation is used. A thick field oxide region (FOX) 102, typically having a thickness of about 3,000 to 8,000 angstroms, is created using conventional methods for the purposes of isolation. The methods are well-known and need not be discussed further herein.

Initially, a gate 104 is created atop the substrate 100 for use as the gate of the access transistor of the DRAM cell. Conventionally, the gate 104 includes a gate oxide and a gate electrode. The gate oxide may be formed by using an oxygen-steam ambient or other known oxide chemical composition and procedures. In the preferred embodiment, the thickness of the gate oxide layer is about 40 to 100 angstroms. The gate electrode is consequently formed from polysilicon material. As is known in the art, the polysilicon can be formed by using low pressure chemical vapor deposition (LPCVD), using silane ($SiH_4$) and phosphine ($PH_3$) as sources. The thickness of the polysilicon is approximately 1,000 to 5,000 angstroms. A source region 106 and a drain region 108 are formed adjacent the gate 104 using well-known ion implantation techniques and will not be further described herein.

Still referring to FIG. 1, a first dielectric layer 109 is deposited onto the substrate 100 using conventional CVD techniques. The thickness of the first dielectric layer 109 is about 3,000 to 10,000 angstroms. The first dielectric layer 109 is preferably formed of a layer of TEOS oxide of about 1000 to 2000 angstroms, followed by a BPSG layer of about 2000 to 6000 angstroms, followed by another layer of TEOS oxide of about 2000 to 8000 angstroms. Next, oxide chemical mechanical polishing (CMP) is performed on the first dielectric layer 109 to achieve global planarization. A node contact opening 110 is then defined by using conventional photolithography and etching processes. The node contact opening 110 extends down to the substrate 100.

Figure 2:
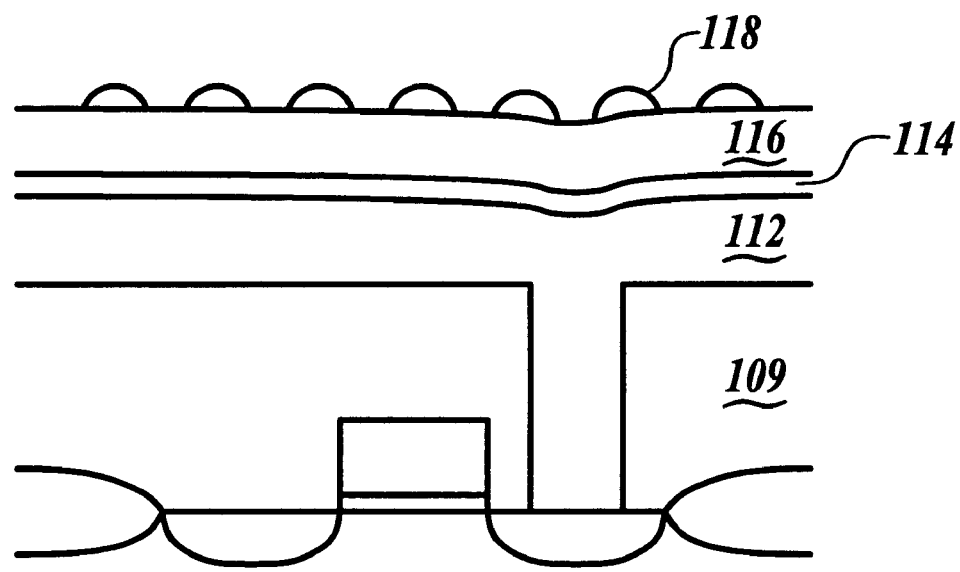

Turning to FIG. 2, a conductive material 112 is deposited into the contact opening 110 and atop the first dielectric layer 109. In the preferred embodiment, the contact opening 110 is filled with tungsten. The tungsten is formed by conventional CVD techniques. The tungsten layer 112 is about 2000 to 8000 angstroms thick from the top surface of the first dielectric layer 109. Next, a barrier layer 114, preferably formed of titanium nitride (TiN), is deposited atop the tungsten layer 112 by using conventional PVD techniques. The titanium nitride layer 114 is about 500 to 2000 angstroms thick. Then a second dielectric layer 116, preferably formed of silicon oxide ($SiO_2$), is deposited atop the titanium nitride layer 114 by using CVD techniques. The second silicon oxide layer 116 is about 1000 to 4000 angstroms thick. A discrete hemispherical grain polysilicon (HSG) layer 118 is then deposited atop the second silicon oxide layer 116. The HSG layer 118 may be deposited using a conventional CVD method. The spacing between the hemispherical grains is preferably about 500 to 3000 angstroms. The HSG layer 118 is used as a masking layer for subsequent etching.

Figure 3:
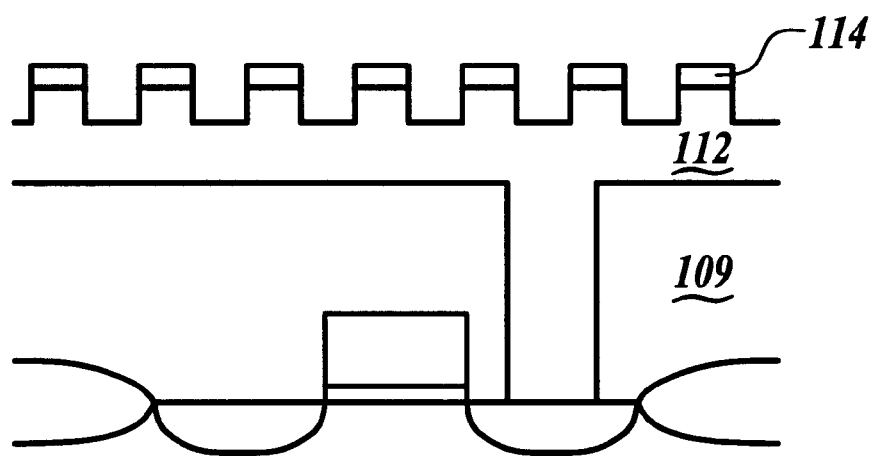

The second silicon oxide layer 116 is etched by using the HSG layer 118 as a mask. Preferably, an oxide reactive ion etching (RIE) method is used. The HSG layer 118 is stripped, preferably by a polysilicon RIE method. Next, the titanium nitride layer 114 and the tungsten layer 112 are etched by using a remaining portion of the second silicon oxide layer 116 as a mask. The remaining portion of the second silicon oxide layer 116 is then stripped, preferably by an oxide RIE method. The resulting structure is shown in FIG. 3.

Figure 4:
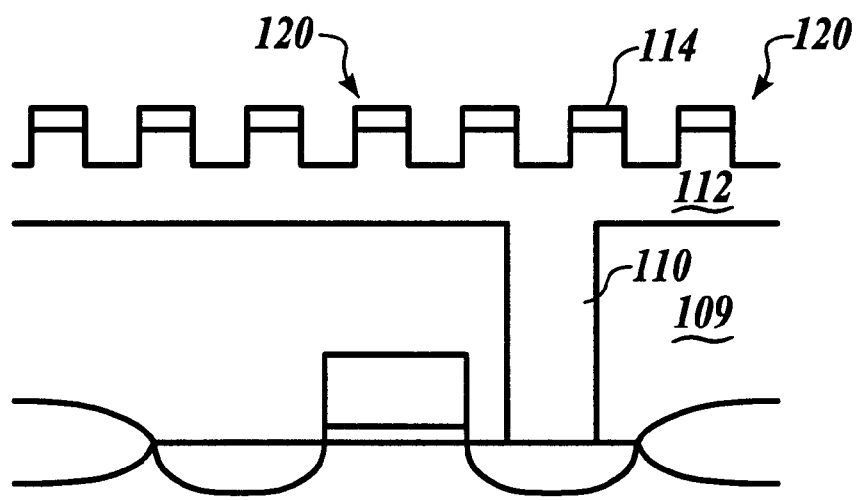

Next, the remaining tungsten layer 112 and the remaining titanium nitride layer 114 are patterned and etched using conventional photolithography and etching techniques. The resulting crown structure is shown in FIG. 4. Sections 120 extend outwardly beyond the contact opening 110 and, in the preferred embodiment, extend approximately 0.1 to 0.5 microns from the edge of the contact opening 110. Those portions of the tungsten layer 112 that are not directly above the contact opening 110 and that are outside of the sections 120 are removed. Lastly, a high dielectric film, preferably titanium oxide ($Ta_2O_5$) is deposited and a second metal, such as titanium nitride or tungsten is deposited.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a metal-insulator-metal capacitor on a substrate, the method comprising the steps of:

forming a first dielectric layer onto said substrate;

patterning and etching said first dielectric layer to form a contact opening;

forming a first metal layer onto said first dielectric layer and into said contact opening;

forming a barrier layer onto said first metal layer;

forming a second dielectric layer onto said barrier layer;

forming a discrete HSG layer onto said second dielectric layer;

etching said second dielectric layer by using said HSG layer as a mask;

stripping said HSG layer;

etching said barrier layer and said first metal layer by using a remaining portion of said second dielectric layer as a mask;

stripping said remaining portion of said second dielectric layer;

patterning and etching a remaining portion of said barrier layer and a remaining portion of said first metal layer;

forming a third dielectric layer over said barrier layer, said first metal layer and said first dielectric layer; and forming a second metal layer over said third dielectric layer.

2. The method of claim 1, wherein said first dielectric layer is formed of a first TEOS oxide layer, followed by a BPSG layer, following by a second TEOS oxide layer.

3. The method of claim 1, wherein said second dielectric layer is formed of silicon oxide.

4. The method of claim 1, wherein said third dielectric layer is formed of a high dielectric film.

5. The method of claim 1, wherein said barrier layer is formed of titanium nitride.

6. The method of claim 1, wherein said first metal layer is formed of tungsten.

7. A method of manufacturing a bottom storage node of a metal-insulator-metal capacitor onto a substrate, the method comprising the steps of:

forming a first dielectric layer onto said substrate;

patterning and etching said first dielectric layer to form a contact opening;

forming a first metal layer onto said first dielectric layer and into said contact opening;

forming a barrier layer onto said first metal layer;

forming a second dielectric layer onto said barrier layer;

forming a discrete HSG layer onto said second dielectric layer;

etching said second dielectric layer by using said HSG layer as a mask;

stripping said HSG layer;

etching said barrier layer and said first metal layer by using a remaining portion of said second dielectric layer as a mask;

stripping said remaining portion of said second dielectric layer;

patterning and etching a remaining portion of said barrier layer and a remaining portion of said first metal layer.

8. The method of claim 7, wherein said first dielectric layer is formed of a first TEOS oxide layer, followed by a BPSG layer, following by a second TEOS oxide layer.

9. The method of claim 7, wherein said second dielectric layer is formed of silicon oxide.

10. The method of claim 7, wherein said third dielectric layer is formed of a high dielectric film.

11. The method of claim 7, wherein said barrier layer is formed of titanium nitride.

12. The method of claim 7, wherein said first metal layer is formed of tungsten.

* * * * *